United States Patent [19]

Sakurai et al.

[11] 3,997,345
[45] Dec. 14, 1976

[54] PROCESS FOR PREPARING IMAGE PLATES WITH CONTINUOUS GRADATION

[75] Inventors: Kiyomi Sakurai, Neyagawa; Yutaka Fukushima, Toyoaka; Masami Yamaguchi, Sakai, all of Japan

[73] Assignee: Nippon Paint Co., Ltd., Osaka, Japan

[22] Filed: Jan. 10, 1975

[21] Appl. No.: 539,991

[30] Foreign Application Priority Data

Jan. 14, 1974 Japan ............................ 49-7209
May 17, 1974 Japan ............................ 49-56014

[52] U.S. Cl. ..................... 96/35.1; 96/33; 96/36.3
[51] Int. Cl.² .............................. G03C 5/10
[58] Field of Search ............... 96/35.1, 33, 36.3

[56] References Cited
UNITED STATES PATENTS

| | | | |
|---|---|---|---|
| 3,685,993 | 8/1972 | Makhersee | 96/33 |
| 3,784,378 | 1/1974 | Gramas | 96/33 X |
| 3,807,304 | 4/1974 | Gracia et al. | 96/33 X |
| 3,829,315 | 8/1974 | Schadlick et al. | 96/33 |
| 3,835,780 | 9/1974 | Gracia et al. | 96/33 X |
| 3,856,529 | 12/1974 | Schadlick et al. | 96/33 X |
| 3,861,917 | 1/1975 | Magnolta et al. | 96/33 |

*Primary Examiner*—Mayer Weinblatt
*Attorney, Agent, or Firm*—Wenderoth, Lind & Ponack

[57] ABSTRACT

A process for preparing an image plate with continuous gradation having a continuous unevenness which comprises exposing a photosensitive resin plate comprising a supporting material and a layer of a photopolymerizable resin composition being in a solid or liquid state at room temperatures and comprising an addition polymerizable, ethylenically unsaturated compound, a binding agent of polymer and a photopolymerization initiator provided thereon through a film with continuous gradation and subjecting the exposed resin plate to development, characterized in that the exposure is made in such a condition that oxygen or a gas containing oxygen is present between the photopolymerizable resin layer and the film.

10 Claims, 4 Drawing Figures

PROCESS FOR PREPARING IMAGE PLATES WITH CONTINUOUS GRADATION

The present invention relates to a process for preparing image plates with continuous gradation having a continuous unevenness. More particularly, it relates to a process for preparing image plates with continuous gradation in which a relief pattern with continuous gradation or an engraving image with continuous gradation is formed on an original plate having a layer of a photopolymerizable resin composition containing an addition polymerizable, ethylenically unsaturated compound.

Hitherto, the preparation of relief plates with continuous gradation having a continuous unevenness has been effected by engraving uneven lines on a metal or plastic plate at certain intervals by the aid of a relief graving machine so as to form a relief pattern. For preparation of engraving plates, there are known a method in which a smoothly polished surface of a metal plate is engraved manually by specific graver or by the aid of a graving machine such as a design graving machine, a parallel line graving machine or a pantograph and a method in which a film of an anticorrosive material is formed on a smoothly polished surface of a metal plate, the film is scratched by a specific needle to draw out a desired image so as to remove off the anticorrosive material corresponding to the image and then the metal plate is treated with acid solutions with different concentrations several times to etch the bared metal parts so as to obtain an intaglio with thick and thin tones. For preparation of photogravures known as gravures, there has been adopted a method in which a carbon tissue given a photosensitivity by treatment with a potassium bichromate solution is exposed through a gravure screen film and then through a positive film with continuous gradation, the exposed tissue is transcribed to a copper plate or a copper cylinder and developed with warm water and then etching is effected through the tissue with ferric chloride solutions of different concentrations successively to obtain an gravure plate with various depth depending on the tone of the photograph. These conventional methods are, however, disadvantageous in various respects, because they necessitate engraving of a metal plate or a plastic plate or utilize etching of a metal with an acid solution. For example, high techniques are required in operations, and a long duration of time is necessary for accomplishing the procedures to make the cost large. Further, preparation and handling of acid solutions with different concentrations are troublesome, and in addition, the use of an acid causes various problems such as environmental pollution, treatment of the waste water, etc.

As a new material for plate making which can take the place of metal and plastic plates as mentioned above, there have recently been introduced photopolymer plates comprising a supporting material and a layer of a photopolymerizable resin provided thereon. Formation of a relief image on such a photopolymer plate is effected by exposing the layer of the photopolymerizable resin through a negative and developing the exposed layer to eliminate non-exposed parts. According to this method, however, there are obtained only letter press printing plates having an image in an identical plane, but plates having a three-dimensional relief pattern with continuous unevenness or an engraving image for gravure printing can not be prepared. In addition, the use of photopolymerizable resins is limited to letter press printing.

As the result of an extensive study for overcoming such drawbacks as seen in the conventional method, it has now been found that a plate having a relief pattern with continuous unevenness or an engraving image can be prepared by using a certain kind of photopolymerizable resins and by effecting the exposure in a condition that air is present between the photosensitive resin plate and a film with continuous gradation.

According to the present invention, there is provided a process for preparing an image plate with continuous gradation which comprises exposing a photosensitive resin plate having a layer of a photopolymerizable resin composition containing an addition polymerizable, ethylenically unsaturated compound through a film with continuous gradation in a condition that oxygen or a gas containing oxygen is present between the photosensitive layer and the film, and developing the exposed resin plate to eliminate non-hardened parts.

The photosensitive resin plate to be used in the invention comprises a supporting material and a photosensitive layer of a photopolymerizable resin composition containing an addition polymerizable, ethylenically unsaturated compound provided thereon. The resin plate may be either in a solid state or in a liquid state at room temperatures. The photosensitive layer may be in an optional form such as a plane or a curved surface. The available thickness of photosensitive layer is from 0.1 to 3 mm.

The photopolymerizable resin composition of the invention comprises an addition polymerizable, ethylenically unsaturated compound, a binding agent of polymer for molding the resin composition into a plate form and a photopolymerization initiator capable of promoting the polymerization of the ethylenically unsaturated compound under active rays in a short time.

The addition polymerizable, ethylencially unsaturated compound may be a compound having at least one, usually one to four, addition polymerizable double bonds at the terminal(s) of its molecule. Specific examples are acrylic acid, methacrylic acid, acrylamide, methacrylamide, N-t-butylmethacrylamide, N,N'-methylenebismethacrylamide, styrene and salts and esters of acrylic acid and methacrylic acid. As salts of acrylic acid and methacrylic acid, there may be exemplified metal salts such as sodium salts, calcium salts and zinc salts and ammonium salts. As esters of acrylic acid and methacrylic acid, there may be exemplified alkyl esters such as methyl esters, ethyl esters, n-butyl esters, isobutyl esters, octyl esters, 2-ethylhexyl esters and lauryl esters, hydroxyalkyl esters such as $\beta$-hydroxyethyl esters and $\beta$-hydroxypropyl esters, mono and diesters with polyethylene glycols having 1 to 23 ethylene oxide units and tri- and tetraesters with tri- and tetramethylolalkanes (e.g. trimethylolmethane, trimethylolethane, trimethylolpropane).

As the binding agent of polymer, there may be exemplified a polyvinyl alcohol, a partially saponified polyvinyl acetate, a carbamyl polyvinyl alcohol, a cellulose derivative such as an alkylcellulose (e.g. methylcellulose, ethylcellulose), an hydroxyalkyl alkylcellulose ether (e.g. hydroxypropyl methylcellulose, hydroxyethyl ethylcellulose), cellulose acetate phthalate or hydroxypropyl methylcellulose phthalate, a polyester resin, a polyamide resin and a polyethylene oxide resin.

As the photopolymerization initiator, the use of benzoin or benzoin alkyl ether (e.g. methyl ether, ethyl ether, isopropyl ether, n-butyl ether, octyl ether) is preferred.

The amount of the ethylenically unsaturated compound to be used is usually 300 parts by weight or less, preferably 20 to 150 parts by weight, to 100 parts by weight of the binding agent of polymer. The amount of the photopolymerization initiator to be used is 0.1 to 10 parts by weight to 100 parts by weight of the ethylenically unsaturated compound.

The film with continuous gradation to be used in the invention may be in a negative state or in a positive state. By the use of the negative, a relief pattern having a continuous unevenness can be produced. In case of using the positive, there can be prepared an engraving image utilizable for gravure priting. It is necessary to adjust the range of densities of the continuous gradation of the film to the range of densities which the photosensitive resin can reproduce. When the range of densities which the photosensitive resin can reproduce is from 0.05 to 1.25, for instance, the range of densities of the film is desired to be from 0.5 to 1.25.

A characteristic feature of the process according to the invention is to effect the exposure in a condition that oxygen or a gas containing oxygen is present between the photosensitive resin layer and the film with continuous gradation. In the photosensitive resin composition of the invention, the photopolymerization is prevented by the presence of oxygen. Therefore, when exposed in such a condition as above mentioned, the resin composition is hardened first from the lower part of the resin layer which is not contacted with oxygen and then gradually to the upper part of the layer. The rate of the hardening is in proportion to the amount of the rays received. Consequently, the degrees of hardening attained correspond to the differences in densities of the film with continuous gradation, and thus an image having a continuous unevenness can be prepared. Thus, according to the invention, the presence of oxygen or a gas containing oxygen between the photosensitive resin plate and the film with continuous gradation makes it possible to prepare an image with continuous gradation. The amount of oxygen to be present may be optionally decided from a wide range from reduced pressures to elevated pressures, provided that preparation of a satisfying image is assured.

The present invention will be hereinafter illustrated more in detials.

In case of the resin being in a solid state at room temperatures, it may be applied on a surface of a suitable supporting material such as a metal plate, a plastic plate or a glass plate to make a layer, on the surface of which a film with continuous gradation is placed. When the surface of the resin layer is adhesive, adhesion between the surface of the resin layer and the film becomes too large. Therefore, it is necessary to apply uniformly a powdery material such as magnesium silicate on the surface of the layer for diminishing the adhesion so as to keep a designated amount of air between the resin layer and the film. The film is then covered with a transparent plate such as a glass plate, a hard plastic plate or a soft plastic plate, and the thus piled plate is kept under a reduced pressure to contact the resin with the film uniformly so as to prevent formation of fog in the image produced. The degree of the reduction of air pressure (from atmospheric pressure) in this case is desired to be small (e.g. 31 cm Hg or less), since a certain amount of air should be present between the resin layer and the film. With a degree of the reduction of pressure larger than the above mentioned limit, there may not be prepared a continuous unevenness corresponding to the differences in densities of the film with continuous gradation, and merely a relief printing of identical plane will be obtained. The resin plate thus contacted with the film with continuous gradation under a reduced pressure, for instance, of 31 cm Hg or less is subjected to exposure with ultraviolet rays. After completion of the exposure, the resin plate is developed with a solvent capable of dissolving the resin such as water, an aqueous alkali or an alcohol whereby an image having a continuous unevennesss corresponding to the differences in densities of the film can be obtained. In case of the surface of the photosensitive resin plate being curved, the film with continuous gradation placed thereon is supported with, for instance, cellophane tape at both ends and kept in such a condition, by utilizing a wind pressure, that uniform contact with the resin layer is maintained whereby a desired amount of air can be present between the resin layer and the film.

In case of the photopolymerizable resin being in a liquid state at room temperatures, it is poured into a frame provided along the surroundings of a suitable supporting material (e.g. a glass plate, a metal plate, a plastic plate) in such a manner that foam is not produced in the resin. The thus charged resin is kept in a horizontal state, and a film with continuous gradation is put horizontal about 25 to 500 $\mu$ above the surface of the resin. The interval between the resin and the film may be optionally selected from the said range so as not to produce fog in the obtained image depending on the strength of the parallel rays from a light source. The thus piled resin plate is exposed with ultraviolet rays and developed with a solvent to obtain an image having a continuous unevenness. Thus, in case of a liquid resin, a material space is provided between the surface of the resin and the film to keep air between them. It is required that the liquid resin does not contain a material promoting the hardening of the surface of the resin such as a paraffin, because the contact of the surface of the resin with air is inhibited due to floating and film formation of such a material.

The following descriptions will illustrate the preparation of a gravure plate from the photosensitive resin plate according to the invention.

For preparing a gravure plate which has concavities of different depths to be filled with ink on printing, formation of concave points in a cell state is necessitated, so that the resin plate is subjected to printing in two steps. First, an image is exposed through a positive film with continuous gradation by the above mentioned procedure and then a screen is exposed through a gravure screen film by a conventional procedure adopted for plate making of a letterpress printing from a photosensitive resin plate. The thus exposed resin plate is developed to remove off the unhardened part whereby a so-called conventional gravure plate in which the bank parts to be scratched by a doctor to remove off the ink on gravure printing are in an identical plane and the concave parts to be filled with the ink have different depths depending on the densities of the positive film can be obtained.

With reference to the accompanying drawings, FIG. 1 is a schematic illustration showing the status of a screen exposure in which the numerals 1, 11, 12 and 3 represent a photosensitive resin plate, a supporting material, a layer of the photosensitive resin and a gravure screen film, respectively. The photosensitive resin plate 1 is closely contacted with the gravure screen film 3 under a reduced pressure and subjected to irradiation with active rays. The degree of the reduction of pressure is desired to be as large as possible within the vacuum printing frame, for instance, 60 cm Hg or more. This is a conventional procedure for plate making of a letterpress printing from a photosensitive resin plate. Since the photosensitive resin plate 1 is closely contacted with the film 3 under a highly reduced air pressure, hardening of the resin is attained completely up to the surface of the resin layer without any influence of oxygen present in the atmosphere to produce solid banks 12a to be scratched by a doctor for removing off the ink on gravure printing.

FIG. 2 is a schematic illustration showing the status of image exposure in which the numeral 4 represents a positive film with continuous gradation. In image exposure, exposure is effected in a condition that oxygen or air is present between the film 4 and the resin plate 1. Such a condition can be attained by providing a material space between the resin plate 1 and the film 4, or, in case of using vacuum printing frame, by adopting a relatively low degree of the reduction of pressure. In the former method in which a material space is provided, a light source generating parallel rays is necessitated because a fog in image may be produced due to floating of the film 4. It is preferred from this point of view to adopt the latter method in which the image exposure is effected under a reduced pressure by the use of a vacuum printing frame. The degree of the reduction of pressure may be appropriately decided depending on the sensitivity of the resin and on the range of densities of the positive film with continuous gradation so as to obtain an optional inclination of the cell depths at a range of densities to be reproduced. With a larger amount of oxygen or air present between the film 4 and the resin plate 1, the inclination of the cell depths from low densities to high densities of the film becomes steeper. With a smaller amount, the inclination becomes gentler. Therefore, the degree of the reduction of pressure is desired to be not larger than 31 cm Hg for regulating the amount of oxygen or air to an appropriate range for preparing a continuous image 12b. When the degree of the reduction of pressure is larger than the said limit, the resin plate 1 is contacted with the film 4 too closely, and the differences of depths at cells are lost so that gradation of tone can not be reproduced.

Figure 1:
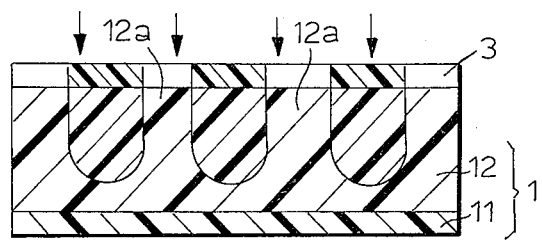
Figure 2:
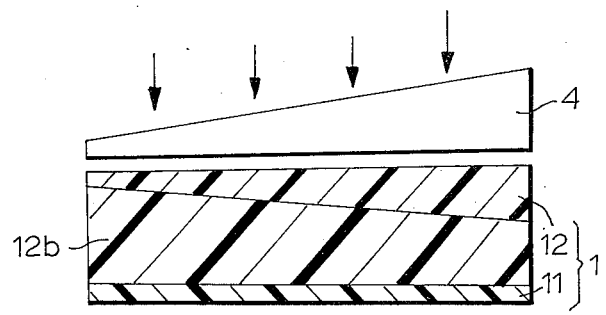
Figure 3:
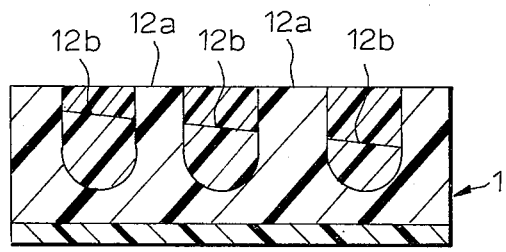
FIG. 3 is a schematic illustration showing the status of the photosensitive resin plate hardened by the screen exposure and the image exposure.
Figure 4:
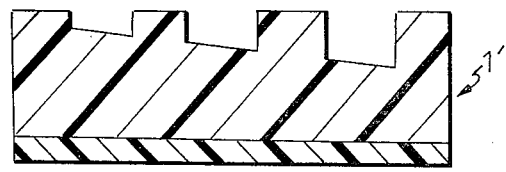
FIG. 4 is a schematic illustration of a gravure plate 1' obtained by developing the photosensitive resin plate as shown in FIG. 3 by a conventional procedure to remove off the unhardened parts.

In the invention, it is not necessary to take account of the order of the screen exposure shown in FIG. 1 and the image exposure shown in FIG. 2. In other words, the image exposure and then the screen exposure may be carried out. In any event, a gravure plate shown in FIG. 4 can be obtained.

The above descriptions are an explanation on a photosensitive resin being in a solid state at room temperatures. In case of a liquid photosensitive resin too, a gravure plate can be prepared in a similar manner. In this case, the image printing shown in FIG. 2 is effected first. The photosensitive resin plate is exposed with parallel rays through a positive film in a condition that a space is provided between the positive film and the surface of the resin. After completion of the image exposure, the surface of the resin is closely contacted with a gravure screen film and subjected to exposure to effect the screen exposure. It is important in case of a liquid photosensitive resin to effect first the image exposure and then the screen printing, unlike the case of a solid photosensitive resin. If the order of the two kinds of exposure is reversed, unhardened liquid resin closely contacted with the film by the screen exposure is readily removed off together with the film on peeling off the same to make the subsequent image exposure impossible.

In the photosensitive resin composition of the invention, various additives may be incorporated in addition to the addition polymerizable, ethylenically unsaturated compound, the binding agent of polymer and the photopolymerization initiator. For example, there may be incorporated a polymerization inhibitor or an oxidation inhibitor for stabilizing the resin composition such as hydroquinone, p-methoxyphenol, 2,6-di-tert-butyl-p-cresol, 2,5-di-tert-butylhydroquinone or 2,5-ti-tert-amylhydroquinone. For increasing the strength of the resin composition, a filler such as a powdery inorganic material (e.g. glass, mica, talc) or a powdery synthetic polymer (e.g. polyethylene, polymethyl methacrylate) may be incorporated. For enhancing decorative ability of the relief pattern having a continuous unevenness prepared from the photosensitive resin, there may be incorporated various coloring matters such as dyes and pigments in an amount of 0.0001 to 10 parts by weight to 100 parts by weight of the photosensitive resin composition.

It is an advantage of the present invention that photopolymerizable resins hitherto used only in letter press printing can be employed for gravure printing. It is another advantage of the invention that a relief pattern provided thereby can be utilized for preparation of various articles such as portraits, displays, interior decorations and name plates.

Practical and presently preferred embodiments of the invention are illustratively shown in the following Examples wherein parts are by weight.

EXAMPLE A

Partially saponified polyvinyl acetate (degree of saponification, 80.0 mol %; mean degree of polymerization, 500) (100 parts) is dissolved in pure water (100 parts) at 90° C in 60 minutes with stirring. The temperature is lowered to 60° C, and a mixture of β-hydroxyethyl methacrylate (90 parts), benzoin isopropylether (3.6 parts) and 2,6-di-tert-butyl-p-cresol (0.18parts) is portionwise added thereto in 15 minutes. The resultant mixture is kept under a reduced pressure to eliminate foam whereby a photopolymerizable resin composition is obtained.

The resin composition is poured on an aluminum plate of 0.3 mm in thickness whose surface is subjected to setting with sand, and a hard vinyl chloride sheet of 0.5 mm in thickness is placed thereon. The thus piled product is subjected to rolling through two rolls provided at an interval of 1.7 mm. Then, the vinyl chloride sheet is peeled off, and the aluminum plate having a layer of the resin composition is dried at 70° C for 50 minutes in a drying furnace to evaporate water whereby a photosensitive resin plate of about 1 mm in thickness is obtained.

EXAMPLE B

To hydroxypropyl methylcellulose (content of methoxy groups, 28–30 mol %; content of hydroxypropoxy groups, 7–12 mol %; molecular weight, about 9300) (100 parts), a mixture of $\beta$-hydroxyethyl methacrylate (70 parts), diethyleneglycol dimethacrylate (20 parts), ethylene glycol (7 parts), benzoinisopropylether (2.1 parts) and p-methoxyphenol (0.04 part) is added, and the resultant mixture is stirred in a mixer at room temperatures for 30 minutes. The thus obtained mixture is poured on an aluminum plate of 0.3 mm in thickness whose surface is subjected to setting with sand, and a polyester sheet of 0.1 mm in thickness is placed thereon. The thus filed product is pressed at 120° C by a press under a pressure of 20 kg/cm² for 30 seconds to obtain a photosensitive resin plate.

EXAMPLE C

An unsaturated polyester resin (60 parts) obtained by condensation of maleic anhydride (98 parts, 1 mol) and propylene glycol (84 parts, 1.1 mols) under heating in nitrogen stream is dissolved in a mixture of styrene (30 parts) and ethylene glycol dimethacrylate (10 parts) at room temperature, and benzoinisopropylether (1.2 parts) and 2,6-di-tert-butyl-p-cresol (0.08part) are added thereto to obtain a liquid photopolymerizable resin composition.

EXAMPLE D

To 105 parts of a dispersion of a red pigment ("Colofine Red 236" manufactured by Dainippon Ink Co., Ltd.) (5 parts) in a 10% aqueous solution of partially saponified polyvinyl acetate (degree of saponification, 80.0 mol %; average degree of polymerization, 500) (100 parts), said partially saponified polyvinyl acetate (90 parts) is added, and the resultant mixture is stirred at 90° C for 60 minutes to make a solution. After lowering the temperature to 60° C, a mixture of benzoin isopropyl ether (4.5 parts), 2,6-di-tert.-butyl-p-cresol (0.18 part) and $\beta$-hydroxyethyl methacrylate (90 parts) is dropwise added thereto in 15 minutes, followed by defoaming under reduced pressure to give a photopolymerizable resin composition.

The resin composition is poured on an aluminum plate of 0.3 mm in thickness whose surface is subjected to setting with sand, and a hard vinyl chloride sheet of 0.5 mm in thickness is placed thereon. The thus piled product is subjected to rolling through two rolls provided at an interval of 1.5 mm. Then, the vinyl chloride sheet is peeled off, and the aluminum plate having a layer of the resin composition is dried at 70° C for 40 minutes in a drying furnace to evaporate water whereby a photosensitive resin plate of about 0.8 mm in thickness is obtained.

EXAMPLE 1

On the photosensitive resin plate obtained in Example A, a film having 21 grades of densities, i.e. Photographic Step Tablet No. 2 manufactured by Eastman Kodak (densities, 0.05 to 3.05; difference of densities in each grade, 0.15) is placed, and a polished glass plate of 5 mm in thickness is put thereon. The thus piled product is irradiated by the aid of a fluorescent lamp of ultraviolet rays (20 W) for 8 minutes from a distance of 5 cm. Then, the exposed plate is developed by spraying tap water on its surface for 3 minutes and dried at 100° C for 4 minutes in a drier to obtain an image in which the continuous gradation in the form of stairs is clearly reproduced at 9 grades of densities from 0.05 to 1.25, the difference of height in each step being constant (about 25 $\mu$).

EXAMPLE 2

On the photosensitive resin plate obtained in Example A, the photographic step tablet No. 2 as used in Example 1 is placed, and a soft vinyl chloride sheet of 0.1 mm in thickness is put thereon. The thus piled product is kept under a degree of the reduction of pressure of 10 cm Hg by a vacuum lamp, and irradiation is made from a distance of 70 cm by a high pressure mercury lamp (3KW) for 2 minutes while maintaining the reduction of pressure. Then, the irradiated product is developed and dried as in Example 1 to give an image, in which the continuous gradation in the form of stairs is clearly reproduced at 8 grades of densities from 0.05 to 1.10, the difference of height in each step being constant (about 20 $\mu$).

EXAMPLE 3

On the surface of the photosensitive resin plate obtained in Example B, powdery magnesium silicate is applied uniformly to eliminate the adhesiveness of the resin composition. The thus treated resin plate is exposed through a negative film with continuous gradation having a pattern of densities from 1.2 to 2.3 by a high-pressure mercury lamp for 4 minutes from a distance of 70 cm under a degree of the reduction of pressure of 5 cm Hg and then developed with tap water for 5 minutes whereby an image of a relief pattern with continuous unevenness is obtained.

EXAMPLE 4

The liquid photopolymerizable resin composition obtained in Example C is poured on a glass plate surrounded by a frame of 1 mm in height to make a layer of 0.7 mm in thickness. On the frame, the photographic step tablet No. 2 as used in Example 1 is placed and kept horizontally, the distance between the surface of the resin and the tablet being 0.3 mm. Then, irradiation is made by a high pressure mercury lamp (3 KW) for 5 minutes from a distance of 1 mm. After the exposure, the surface of the resin is washed with acetone for 1 hour to effect development and dried in the atmosphere. In the thus obtained image, continuous gradation in the form of stairs is clearly reproduced at 11 grades of densities from 0.05 to 1.55, the difference of height in each step being constant (about 40 $\mu$).

EXAMPLE 5

The photosensitive resin plate obtained in Example A is closely contacted with a gravure screen film (150 lines) under a degree of the reduction of air pressure of 70 cm Hg in a vacuum printing frame and is irradiated by a high pressure mercury lamp (3 KW) for 20 second from a distance of 70 cm. Then, the film is peeled off, and a positive film with continuous gradation having a grain pattern of densities from 0.7 to 1.9 is placed on the resin plate under a degree of the reduction of air pressure of 5 cm Hg. Exposure is made as above for 2 minutes, and then the film is peeled off. The thus exposed resin plate is developed by spraying tap water on the surface of the resin for 2 minutes to obtain a gravure printing plate.

Using the thus prepared gravure printing plate, printing is made by a gravure ink whereby an excellent print with the grain pattern is obtained.

EXAMPLE 6

The photosensitive resin plate as used in Example 5 is subjected to image printing through a positive film with continuous gradation having a pattern of densities of 1.2 to 2.3 under a degree of the reduction of pressure of 5 cm Hg by irradiation of a high pressure mercury lamp (3 KW) for 4 minutes from a distance of 70 cm. Then, the resin plate is exposed as above for 20 seconds through a gravure screen film (150 lines) under a degree of the reduction of air pressure of 70 cm Hg. The thus exposed resin plate is developed and dried as in Example 5 to obtain a gravure printing plate.

Using the thus prepared gravure printing plate, printing is made by a gravure ink whereby an excellent print with the pattern is obtained.

EXAMPLE 7

The photosensitive resin composition obtained in Example D is irradiated through a film with continuous gradation having a pattern of densities from 1.2 to 2.3 by a high pressure mercury lamp for 10 minutes from a distance of 60 cm under a degree of the reduction of air pressure of 5 cm Hg and then developed with tap water for 3 minutes whereby an image of a relief pattern with continuous unevenness is obtained.

What is claimed is:

1. In a process for preparing an image plate with continuous gradation having a continuous unevenness which comprises exposing a photosensitive resin plate consisting essentially of a supporting material and a layer of a photopolymerizable resin composition consisting essentially of an addition polymerizable, ethylenically unsaturated compound, a polymeric binding agent, and a photopolymerization initiator provided thereon through a film with continuous gradation by means of ultraviolet rays and subjecting the exposed resin plate to development, the improvement wherein the exposure is conducted under such conditions that air is present between the photopolymerizable resin layer and the film.

2. The improvement according to claim 1, wherein the exposure is carried out under a reduced pressure of not more than 31 cm Hg or in the presence of an amount of air corresponding to not less than 45 cm Hg.

3. The improvement according to claim 1, wherein the proportion of the ethylenically unsaturated compound, the photopolymerization initiator and the polymeric binding agent in the photopolymerizable resin composition is 20 – 300: 0.02 – 30: 100 by weight.

4. The improvement according to claim 1, wherein the addition polymerizable, ethylenically unsaturated compound is one containing 1 to 4 addition polymerizable ethylene groups(s) at the terminals(s) of its molecule.

5. The improvement according to claim 1, wherein the photosensitive resin composition contains a dye or a pigment as a coloring matter so as to obtain a colored relief pattern with continuous unevenness.

6. The improvement according to claim 1, wherein 0.0001 to 10 parts by weight of a dye or a pigment as a coloring agent is present per 100 parts by weight of the photosensitive resin composition.

7. The improvement according to claim 1, wherein the thickness of the photosensitive resin layer is from 0.1 to 3 mm.

8. The improvement according to claim 1, wherein the air between the photopolymerizable resin layer and the film is present in amounts sufficient to prevent photopolymerization on the surface of the resin film in contact with the air such that polymerization occurs first at the lower part of the resin in contact with the support and gradually proceeds to the upper layer of the resin in contact with the air.

9. In a process for preparing a gravure printing plate which comprises exposing a photosensitive resin plate consisting essentially of a supporting material and a layer of a photopolymerizable resin composition consisting essentially of an addition polymerizable, ethylenically unsaturated compound, a polymeric binding agent and a photopolymerization initiator provided thereon with ultraviolet light first through a positive film with continuous gradation and secondly through a gravure screen film and subjecting the exposed resin plate to development, the improvement wherein the first exposure is conducted under such conditions that air is present between the polymerizable resin layer and the positive film and the second exposure is conducted through the gravure screen film under reduced air pressure.

10. The improvement according to claim 9, wherein the air between the photopolymerizable resin layer and the film is present in amounts sufficient to prevent photopolymerization on the surface of the resin film in contact with the air such that polymerization occurs first at the lower part of the resin in contact with the support and gradually proceeds to the upper layer of the resin in contact with the air.

* * * * *